(12) United States Patent
Brownlee (10) Patent No.: US 12,154,607 B2
(45) Date of Patent: Nov. 26, 2024

(54) CONFIGURABLE OPTICAL DRIVER

(71) Applicant: MACOM Technology Solutions Holdings, Inc., Lowell, MA (US)

(72) Inventor: Merrick Brownlee, Hillsboro, OR (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 269 days.

(21) Appl. No.: 17/402,276

(22) Filed: Aug. 13, 2021

(65) Prior Publication Data

US 2023/0048659 A1 Feb. 16, 2023

(51) Int. Cl.
| | |
|---|---|
| G11B 7/1267 | (2012.01) |
| G11B 7/0045 | (2006.01) |
| H04B 10/564 | (2013.01) |
| H04B 17/11 | (2015.01) |

(52) U.S. Cl.
CPC ........ G11B 7/1267 (2013.01); G11B 7/00456 (2013.01); H04B 10/564 (2013.01); H04B 17/11 (2015.01)

(58) Field of Classification Search
CPC ...... H04B 10/50; H04B 10/564; H04B 17/11; H04B 10/0795; H04B 10/0799; H04B 10/50572; H04B 10/54; H04B 10/504; H04B 10/58; H04B 10/40; H04B 10/503; H04B 10/502; H04B 10/501; H04B 17/15; H04B 17/16; H04B 17/17; H04B 17/18; G11B 7/1267; G11B 7/00456

See application file for complete search history.

(56) References Cited

U.S. PATENT DOCUMENTS

| | | | |
|---|---|---|---|
| 6,792,019 B2 | 9/2004 | Fattaruso | |
| 6,859,473 B1* | 2/2005 | Tan | H01S 5/06808 |
| | | | 372/38.1 |
| 7,185,815 B2 | 3/2007 | Sanchez-Olea | |
| 9,974,129 B1* | 5/2018 | Xiong | H05B 45/385 |
| 10,778,207 B1* | 9/2020 | Nuttgens | H01S 5/0427 |
| 2006/0140233 A1 | 6/2006 | Chin et al. | |
| 2006/0180667 A1* | 8/2006 | Sanchez-Olea | H04B 10/66 |
| | | | 235/454 |

(Continued)

FOREIGN PATENT DOCUMENTS

| | | |
|---|---|---|
| CN | 211743674 | 10/2020 |
| CN | 211743674 U * | 10/2020 |

OTHER PUBLICATIONS

Ng, Kwan Ting et al., "A 25Gb/s Common-Cathode VCSEL Driver," 2014 IEEE Compound Semiconductor Integrated Circuit Symposium (CSICS), IEEE, Oct. 19, 2014 (Oct. 19, 2014), pp. 1-4.

*Primary Examiner* — Hibret A Woldekidan (57) ABSTRACT

A configurable optical driver circuit includes an adjustable current source circuit configurable to drive one of a variety of different types of electrical to optical devices, an adjustable back-termination resistance circuit configurable to provide a back-termination resistance to the one of a variety of different electrical to optical devices, and a programmable memory configured to provide configuration information to the adjustable current source circuit and to the adjustable back-termination resistance circuit to configure the adjustable current source circuit and the adjustable back-termination resistance circuit for operation with the one of a variety of different electrical to optical devices.

14 Claims, 6 Drawing Sheets

(56) References Cited

U.S. PATENT DOCUMENTS

| | | | |
|---|---|---|---|
| 2011/0156604 A1* | 6/2011 | Kuo | H05B 45/46 |
| | | | 315/250 |
| 2014/0105610 A1* | 4/2014 | Azadeh | H05B 45/395 |
| | | | 323/234 |
| 2019/0007141 A1 | 1/2019 | Kawata | |
| 2020/0264043 A1* | 8/2020 | Allen | G01J 3/0229 |
| 2021/0219396 A1* | 7/2021 | Smith | H03F 1/523 |

* cited by examiner

START

↓

610 ACCESS A CONFIGURABLE OPTICAL DRIVER

↓

620 STORE CONFIGURATION INFORMATION IN THE CONFIGURABLE OPTICAL DRIVER TO CONFIGURE THE CONFIGURABLE OPTICAL DRIVER TO DRIVE A SPECIFIC ELECTRICAL TO OPTICAL CONVERSION DEVICE

↓

630 TEST THE CONFIGURED CONFIGURABLE OPTICAL DRIVER

↓

640 LABEL THE CONFIGURED CONFIGURABLE OPTICAL DRIVER IN ACCORDANCE WITH ITS SPECIFIC CONFIGURATION

↓

End

Fig. 6

CONFIGURABLE OPTICAL DRIVER

FIELD OF INVENTION

Embodiments of the present invention generally relate to the field of optical communications, and more specifically to systems and methods for configurable optical drivers.

BACKGROUND

There are significant advantages to integrating an optical driver with the preceding clock and data recovery (CDR) circuitry. Among the benefits of such integration are improved performance, reduced cost, reduced wiring board area, and decreased power consumption/dissipation.

There are numerous optical emitting devices utilized for optical communication. For example, directly modulated lasers (DMLs), electro-absorption modulated lasers (EMLs), and vertical-cavity surface-emitting lasers (VCSELs) are well-known types of laser devices utilized for optical communication. All of these devices, and others, have varying characteristics, including, for example, cost, modulation range, back-termination resistance, biasing scheme, speed of operation, power consumption, rise and fall time, optical power linearity, and electrical to optical conversion efficiency. Such differences typically make one or more such devices attractive and/or unattractive for any given application.

For example, EMLs are generally characterized as having a relatively higher cost than DMLs. DMLs are generally characterized as having a lower range and lower data rate capability in comparison to EMLs. Accordingly, for relatively low range and low data rate applications, DMLs would generally be favored over EMLs. However, an integrated circuit designed to drive an EML would typically not be able to satisfactorily drive a DML.

Unfortunately, such operational characteristic differences among a variety of types of optical emitting devices have typically required different integrated circuits, designed for each different type of optical emitter, to drive the devices in a satisfactory manner.

SUMMARY OF THE INVENTION

It would be highly valuable and desirable for a single packaged device to be able to drive multiple types of electrical to optical devices intended for optical communications.

Therefore, what is needed are systems and methods for configurable optical drivers. What is additionally needed are systems and methods systems and methods for configurable optical drivers that may be configured to drive multiple types of electrical to optical devices. What is further needed are systems and methods for configurable optical drivers that are compatible and complementary with existing systems and methods for optical drivers. Embodiments of the present invention provide these advantages and enhance the user's experience.

In accordance with an embodiment of the present invention, a configurable optical driver circuit includes an adjustable current source circuit configurable to drive one of a variety of different types of electrical to optical devices, an adjustable back-termination resistance circuit configurable to provide a back-termination resistance to the one of a variety of different electrical to optical devices, and a programmable memory configured to provide configuration information to the adjustable current source circuit and to the adjustable back-termination resistance circuit to configure the adjustable current source circuit and the adjustable back-termination resistance circuit for operation with the one of a variety of different electrical to optical devices.

In accordance with another embodiment of the present invention, a configurable optical driver circuit includes a configurable optical driver integrated circuit. The configurable optical driver integrated circuit includes a current mirror circuit having an adjustable current range, a digitally controlled variable resistance to adjust back-termination resistance; and a programmable memory configured to provide configuration information to the current mirror circuit and to the digitally controlled variable resistance to configure the configurable optical driver circuit for operation with one of a variety of different electrical to optical devices. The configurable optical driver circuit also includes a passive biasing network coupled to the configurable optical driver integrated circuit for setting a DC bias at the driver outputs and at the optical device. The passive biasing network provides DC isolation of current to the load.

In accordance with a method embodiment of the present invention, a method includes accessing a configurable optical driver device and storing configuration information into the configurable optical driver device. The storing configures the configurable optical driver device to drive a specific type of electrical to optical conversion device. The method may further include testing a drive function of the configurable optical driver device, subsequent to the storing, for loads corresponding to the specific type of electrical to optical device.

BRIEF DESCRIPTION OF THE DRAWINGS

The accompanying drawings, which are incorporated in and form an integral part of this specification, illustrate embodiments of the invention and, together with the description, serve to explain the principles of the invention. Unless otherwise noted, the drawings are not drawn to scale.

DETAILED DESCRIPTION

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., method 600) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing" or "storing" or "testing" or "configuring" or "reading" or "analyzing" or "generating" or "resolving" or "accepting" or "selecting" or "determining" or "displaying" or "presenting" or "computing" or "sending" or "receiving" or "reducing" or "detecting" or "setting" or "placing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or "capturing" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, the term "manufacture" and related terms is used to refer to the process of producing a tangible apparatus. For example, an integrated circuit device is manufactured after all lithography, including metallization, is complete. A packaged device is manufactured after all internal components are manufactured, coupled together, e.g., wire bonded to a lead frame and/or substrate, and packaged/encapsulated. More particularly, such terms exclude setting or programming memory elements, even if such setting permanently changes a physical characteristic of such elements, e.g., "blowing" of a fusible link.

Configurable Optical Driver

In accordance with embodiments of the present invention, there are three main properties of an output driver for optical communication that should change in order to drive different electro-optical (E/O) loads, e.g., different types of lasers, utilized for optical communications. These are modulation range, back-termination resistance, and biasing scheme. For example, directly modulated lasers (DMLs) typically require a modulation range (at the load) of approximately 20-75 mA peak-to-peak (pp). Vertical-cavity surface-emitting lasers (VCSELs) generally require about 2-10 mApp, while electro-absorption modulated lasers (EMLs) may require about 1-2 Vpp.

Figure 1:
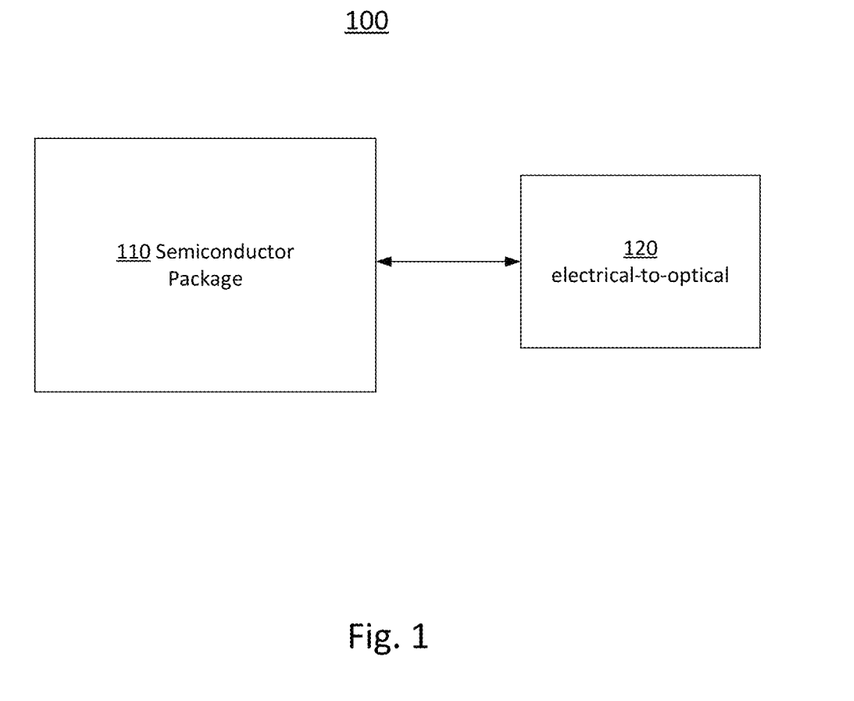
FIG. 1 illustrates an exemplary configurable optical driver system in accordance with embodiments of the present invention.

FIG. 1 illustrates an exemplary configurable optical driver system 100 in accordance with embodiments of the present invention. System 100 comprises a configurable optical driver 110. Configurable optical driver 110 may be embodied in a semiconductor package, e.g., a ball-grid array (BGA), a quad flat pack (QFP), a dual in-line package (DIP), or the like, in some embodiments. Configurable optical driver 110 is configurable, e.g., may be configured, to drive a variety of types of electrical to optical devices 120 that are suitable for optical communication. For example, configurable optical driver 110 may be configured to drive a variety of different types of electrical to optical devices 120. Such electrical to optical devices 120 generally take the form of a laser, although that is not required. Exemplary embodiments of electrical to optical devices 120 may include, for example, directly modulated lasers (DMLs), electro-absorption modulated lasers (EMLs), and vertical-cavity surface-emitting lasers (VCSELs).

Figure 2:
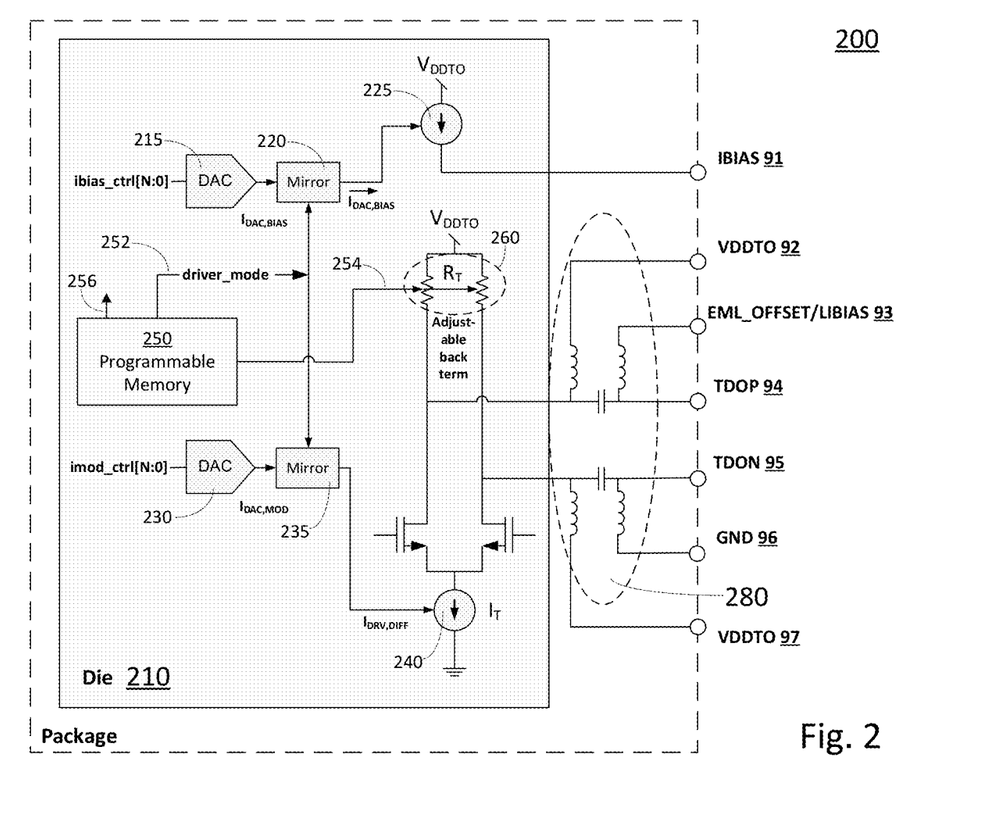
FIG. 2 illustrates an exemplary configurable optical driver in accordance with embodiments of the present invention.

FIG. 2 illustrates an exemplary configurable optical driver 200 in accordance with embodiments of the present invention. Configurable optical driver 200 may correspond to configurable optical driver 110, as described in FIG. 1, in some embodiments. Configurable optical driver 200 may take the outward appearance of a semiconductor package, in some embodiments. Configurable optical driver 200 comprises a semiconductor die 210. Configurable optical driver die 210 comprises clock and data recovery (CDR) circuitry (not shown) suitable for generating digital control signals for optical communication. As an example, configurable optical driver die 210 may encode a communication signal into Pulse Amplitude Modulation (PAM) signals for optical communications.

Configurable optical driver die 210 comprises a digital to analog converter (DAC) 215 configured to accept a digital Ibias (bias current) control signal from the clock and data recovery circuitry to produce an Ibias control signal to current mirror 220. Current mirror 220 is configured to produce a bias control signal to control current source 225. Utilizing a transmitter (TX) output power supply, VDDTO, current source 225 is configured to generate a current to power an electrical to optical device, e.g., electrical to optical device 120, as described in FIG. 1.

Similarly, configurable optical driver die 210 comprises a digital to analog converter (DAC) 230 configured to accept a digital Imod (modulation current) control signal from the clock and data recovery circuitry to produce an Imod control signal to current mirror 235. Current mirror 235 is configured to produce a modulation control signal to control current source 240.

In accordance with embodiments of the present invention, configurable optical driver die 210 comprises a programmable memory 250. Programmable memory 250 may comprise any suitable type of non-volatile memory, including, for example, fuse, anti-fuse, erasable programmable read only memory (EPROM), one-time programmable (OTP) EPROM, electrically erasable programmable read-only memory (E2PROM), and/or flash memories. In some embodiments, programmable memory 250 is embodied on configurable optical driver die 210. In some embodiments, programmable memory 250 is embodied off of configurable optical driver die 210 but within the configurable optical driver 200 package, e.g., as fuses within the configurable optical driver 200 package.

Programmable memory 250 is configured to accept and store configuration information for a desired type of electrical to optical device 120, to be driven by configurable optical driver 200. Such configuration information may be communicated to programmable memory 250 from an external, e.g., off-chip, device (not shown), for example, an automated test equipment (ATE), by any suitable means, including, for example, Inter-Integrated Circuit (I2C) interface, a Joint Test Action Group (JTAG) interface, a Serial Peripheral Interface (SPI), and/or the like. In some embodiments, the information in programmable memory 250 may be changed after an initial programming. For example, a specific instance of configurable optical driver 200 may be configured to drive a DML, and later reconfigured to drive an EML. In some embodiments, configuration information may be communicated to programmable memory 250 after packaging of configurable optical driver 200. In some embodiments, configuration information may be communicated to programmable memory 250 after manufacture of configurable optical driver die 210, but prior to packaging of configurable optical driver 200.

In accordance with embodiments of the present invention, configurable optical driver 200 may be held in a generic, e.g., non-configured, status until a particular configuration is ordered by a customer. Responsive to such an order, configurable optical driver 200 may be configured and/or reconfigured to fulfill such an order. Beneficially, inventory costs may be reduced and supply responsiveness improved, in comparison to the conventional art requirement of maintaining inventory of multiple different drivers to correspond to each of multiple different types of electrical to optical devices.

Programmable memory 250 is configured to provide a driver mode signal 252 to each of current mirrors 220, 235. The driver mode signal 252 may be the same signal to each current mirror 220, 235 in some embodiments, although that is not required. Driver mode signal 252 indicates the specific type and/or electrical characteristics of electrical to optical device 120 that configurable optical driver 200 is configured to drive. Responsive to driver mode signal 252, the current mirrors 220, 235 are configured to be adjusted and/or scaled to produce the drive and tail currents and voltages appropriate to the specific electrical to optical device 120 that configurable optical driver 200 is to drive.

For example, when configurable optical driver 200 is configured to drive a directly modulated laser (DML), configurable optical driver 200 may provide a modulation range (at the load) of approximately 20-75 mA peak-to-peak (pp). When configurable optical driver 200 is configured to drive a vertical-cavity surface-emitting laser (VCSEL), configurable optical driver 200 may provide about 2-10 mApp. When configurable optical driver 200 is configured to drive an electro-absorption modulated laser (EML), configurable optical driver 200 may provide about 1-2 Vpp.

It is appreciated that there is current division between the back termination and the electrical to optical device 120 (FIG. 1) load. Accordingly, the actual current swing required at the driver to achieve the desired current or voltage swing at the load will be different that the current swing at the electrical to optical device 120. For example:

For a DML device:
$I_{SWING,LOAD,DML} = I_{DRV,DIFF} * R_{T,DIFF}/(R_{T,DIFF}+R_{DML})$, where $I_{DRV,DIFF}$ is the driver differential current swing, $R_{T,DIFF}$ is the back termination resistance, and $R_{DML}$ is the DML load resistance (which is a differential load).

For an EML device:
$V_{SWING,LOAD,EML} = I_{DRV,DIFF} * R_{EML} * R_{T,DIFF}/(R_{T,DIFF}+2R_{EML})$ where $I_{DRV,DIFF}$ is the driver differential current swing, $R_{T,DIFF}$ is the differential back termination resistance, and $R_{EML}$ is the EML load resistance (which is a single-ended load—typically 50Ω).

For a VCSEL device:
$I_{SWING,LOAD,VCSEL} = I_{DRV,DIFF} * R_{T,DIFF}/(R_{T,DIFF}+R_{VCSEL})$ where $I_{DRV,DIFF}$ is the driver differential current swing, $R_{T,DIFF}$ is the back termination resistance, and $R_{VCSEL}$ is the VCSEL load resistance (which is a differential load).

For a typical differential pair current driver, $I_{DRV,DIFF}$ is the tail current of the pair. The approximate range required for $I_{DRV,DIFF}$ given the swing requirements and typical load and back termination resistances are:

$I_{DRV,DIFF,DML}$: 24-90 mA
$I_{DRV,DIFF,EML}$: 40-80 mA
$I_{DRV,DIFF,VCSEL}$: 3.4-17 mA

It is appreciated that the DML driver current swing range will cover the EML range; however, the VCSEL current swing range is much lower. To cover the VCSEL current swing range without sacrificing resolution, current mirrors 220, 235 comprise a programmable current range to scale the modulation DAC output current. The control signal 252 that selects the current range is stored in programmable memory 250 on die 210 so that the configuration can be implemented at production test time with no need for any field programming.

In other embodiments of the present invention, current ranging or scaling may be performed by, for example, providing a configurable reference current to a DAC, scaling internal to a DAC, and/or disabling and/or enabling a plurality of output driver devices to provide a desired current.

The back termination may be modified to a desired value for a specific electrical to optical devices 120 (FIG. 1) by making the back termination resistance 260 programmable. In some embodiments, back termination resistance 260 comprises a digitally controlled variable resistance. The programmable control 254 of variable back termination resistance 260 is also stored in programmable memory 250.

Different types of electrical to optical devices 120 may be characterized as having additional differences among types of electrical to optical devices. For example, vertical-cavity surface-emitting lasers (VCSELs) are inherently non-linear in their electrical to optical characteristics. This leads to problems when trying to generate optical signals with a desirable low Transmission Dispersion and Eye Closure Quaternary (TDECQ) factor in pulse amplitude modulation applications. More particularly, VCSELs have high slew rates on the optical rising edge, while at the same time having slow slew rates on the falling edge. Compounding the problem is that the slew rate is not the same at every optical power level.

In accordance with embodiments of the present invention, programmable memory 250 may generate additional driver mode signal(s) 256 to control a variety of circuits, including, for example, DACs 215, 230, current mirrors 220, 235, current sources 225, 240, and/or clock and data recovery (CDR) circuitry (not shown) to adjust driven slew rates on rising and/or falling edges to adjust for such differences among different types of electrical to optical devices. In addition, in accordance with embodiments of the present invention, programmable memory 250 may store additional information to generate control signal(s) 256 to control a variety of circuits to adjust for such differences among different types of electrical to optical devices.

Configurable optical driver 200 further comprises a passive biasing network 280, in accordance with embodiments of the present invention. The passive biasing network 280 is configured to set the necessary DC bias points at both the driver outputs and at the optical device, which often need to operate at different DC voltages from one another. Passive biasing network 280 is included in the package of configurable optical driver 200, but is typically not a part of configurable optical driver die 210, in some embodiments. Components of passive biasing network 280 may be functionally mounted within the package of configurable optical driver 200 by any suitable means, including, for example, on a common substrate with configurable optical driver die 210 and/or mounted to a lead frame of configurable optical driver 200.

In accordance with embodiments of the present invention, an AC (alternating current) coupled passive biasing network 280 comprising ferrites on both sides of the coupling capacitors allows complete independence between the driver and the load. The AC coupling capacitors isolate the DC (direct current) current of the load. Accordingly, there is no DC interaction between the driver and the load. In addition, the bias current path is independent of the high-speed path. In contrast to DC coupled schemes, the total average current in the load is advantageously a function of both the bias and modulation currents and varies depending on the load.

In accordance with embodiments of the present invention, configurable optical driver 200 comprises seven package pins: Ibias 91, Vddto (Transmitter (TX) output power supply) 92, Tdop (Transmitter Positive (non-inverting) Output) 94, Tdon (Transmitter Negative (inverting) Output) 95, GND (ground) 96, and Vddto (Transmitter (TX) output power supply) 97.

Configurable optical driver 200 further comprises EML_Offset/LIbias pin 93. As will be further described below, EML_Offset/LIbias pin 93 has a different function depending upon the type of electrical to optical devices 120 utilized. For example, EML_Offset is an offset bias voltage input required for an electro-absorption modulated laser (EML). An EML needs to be isolated from the high frequency signal path, e.g., by a ferrite or an inductor. LIbias is the isolated bias connection for a directly modulated laser (DML) or a vertical-cavity surface-emitting laser (VCSEL). The bias current source (Ibias) should also be isolated from the high frequency signal path by a ferrite or an inductor, so this is accomplished by connecting Ibias to LIbias for a VCSEL or DML.

Directly modulated lasers (DMLs) present a differential resistance of approximately 10Ω, while Vertical-cavity surface-emitting lasers (VCSELs) present a differential resistance of approximately 70Ω.

Figure 3:
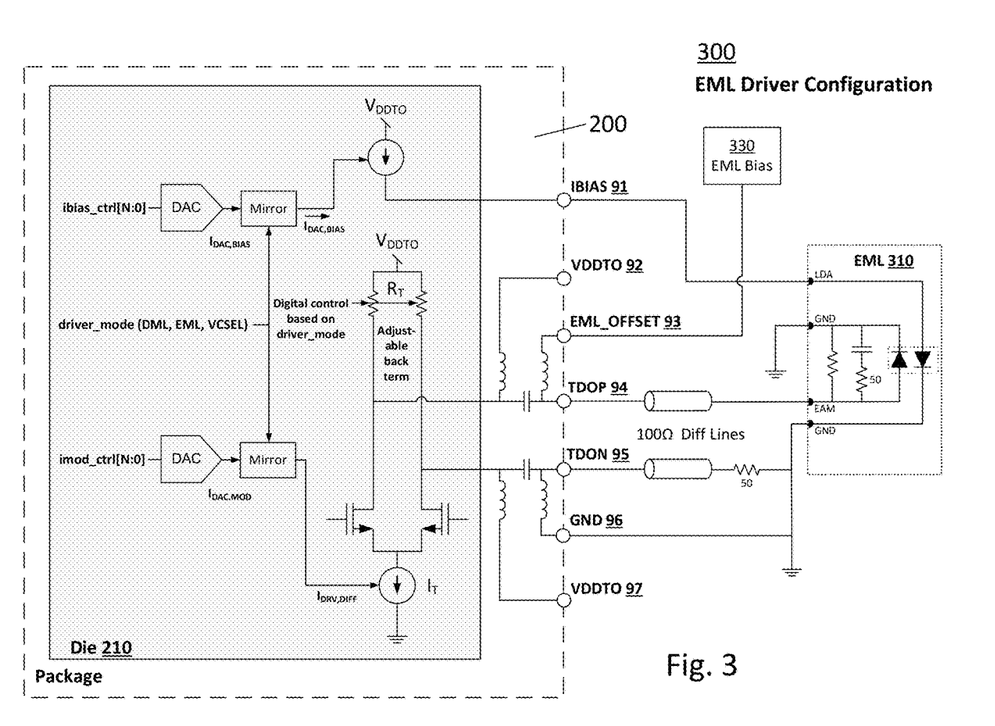
FIG. 3 illustrates an exemplary embodiment of an electro-absorption modulated laser (EML) driver configuration, in accordance with embodiments of the present invention.

FIG. 3 illustrates an exemplary embodiment of an electro-absorption modulated laser (EML) driver configuration 300, in accordance with embodiments of the present invention. Electro-absorption modulated lasers (EMLs) present a differential resistance of approximately 100Ω, although the output is taken as single-ended for EMLs. In order to minimize reflections, it is desirable to match impedance at either the near or the far end of the transmission line between the driver and the electro-optical load.

Configuration 300 comprises configurable optical driver 200 in a configuration to drive electro-absorption modulated laser (EML) device 310. Ibias pin 91 is coupled to a Laser Diode Anode connection (LDA) pin of EML device 310. Tdop (Transmitter Positive (non-inverting) Output) pin 94 is coupled to an electro-absorption modulator (EAM) pin of device EML 310. Tdon (Transmitter Negative (inverting) Output) pin 95 is coupled via a resistance to ground. EML_Offset pin 93 is coupled to EML offset bias voltage adjustment circuitry 330.

Figure 4:
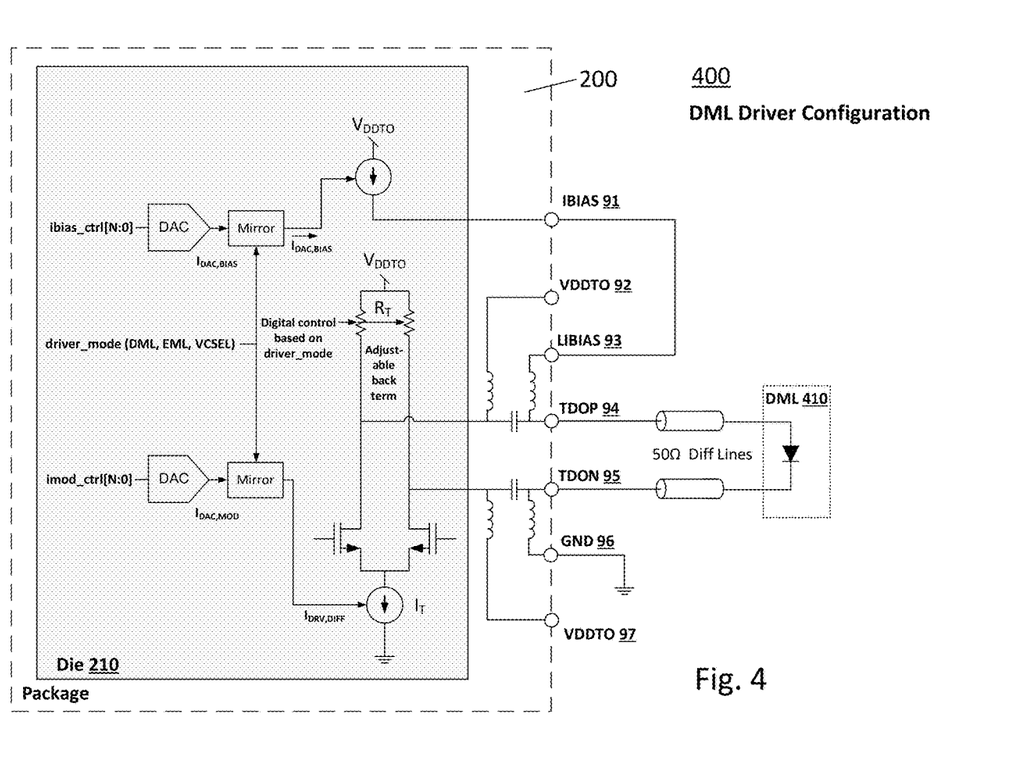
FIG. 4 illustrates an exemplary embodiment of a directly modulated laser (DML) driver configuration, in accordance with embodiments of the present invention.

FIG. 4 illustrates an exemplary embodiment of a directly modulated laser (DML) driver configuration 400, in accordance with embodiments of the present invention. Directly modulated lasers (DMLs) present a differential resistance of approximately 10Ω. For the DML case, since the impedance at the far end is quite low, a practical design approach is to match impedance at the near end. To avoid a large discontinuity at the far end, the driving impedance is usually chosen to be a relatively low 50Ω differential.

Configuration 400 comprises configurable optical driver 200 in a configuration to drive directly modulated laser (DML) device 410. Ibias pin 91 is coupled to isolated bias connection (LIbias) pin 93. Tdop (Transmitter Positive (non-inverting) Output) pin 94 is coupled to an anode pin of DML device 310. Tdon (Transmitter Negative (inverting) Output) pin 95 is coupled to a cathode of DML device 310.

Figure 5:
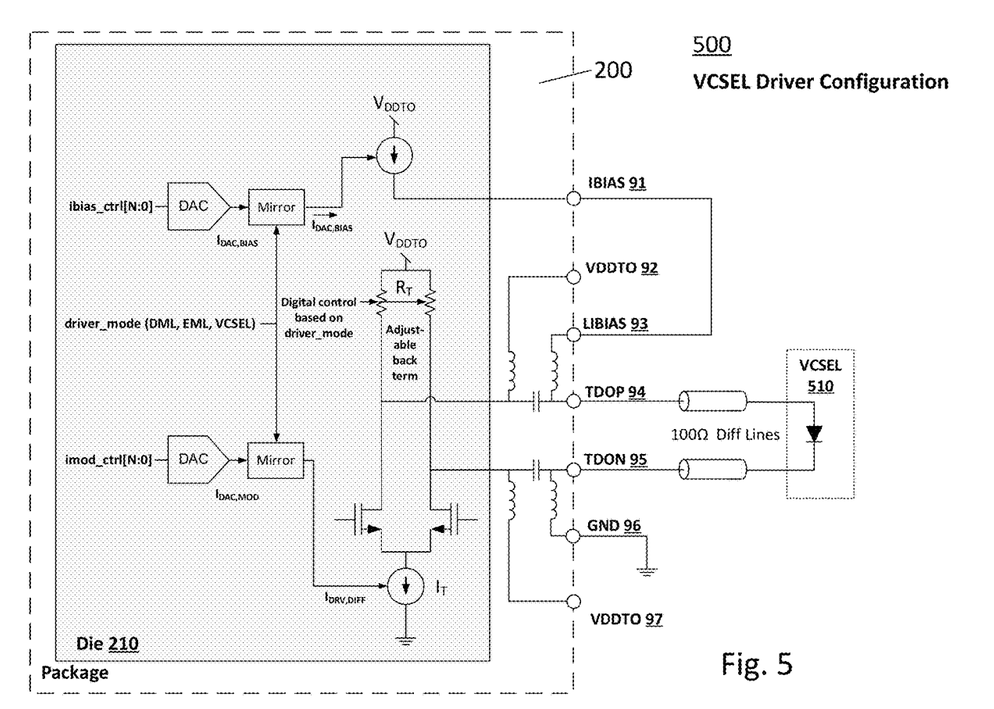
FIG. 5 illustrates an exemplary embodiment of a vertical-cavity surface-emitting laser (VCSEL) driver configuration, in accordance with embodiments of the present invention.

FIG. 5 illustrates an exemplary embodiment of a vertical-cavity surface-emitting laser (VCSEL) driver configuration 500, in accordance with embodiments of the present invention. Vertical-cavity surface-emitting lasers (VCSEL) present a differential resistance of approximately 70Ω. For the VCSEL case, the whole system could be made 70Ω. However, a 100 Ω back-termination, as used with the EML configuration, is acceptable, in accordance with embodiments of the present invention.

Configuration 500 comprises configurable optical driver 200 in a configuration to drive vertical-cavity surface-emitting laser (VCSEL) device 510. Ibias pin 91 is coupled to isolated bias connection (LIbias) pin 93. Tdop (Transmitter Positive (non-inverting) Output) pin 94 is coupled to an anode pin of VCSEL device 510. Tdon (Transmitter Negative (inverting) Output) pin 95 is coupled to a cathode of VCSEL device 510.

In this novel manner, the same instance of a configurable optical driver 200, comprising the same instance of a configurable optical driver die 210 and the same instance of a passive biasing network 280, may drive multiple different electrical to optical devices having different drive and back-termination resistance characteristics. Beneficially, numerous costs, including, for example, design effort cost, design time cost, manufacturing cost and manufacturing duration cost, test development cost, test complexity, amount of necessary test equipment, inventory costs, and opportunity costs are greatly reduced in comparison to the conventional art requiring a different driver device for each different type of electrical to optical converter.

Figure 6:
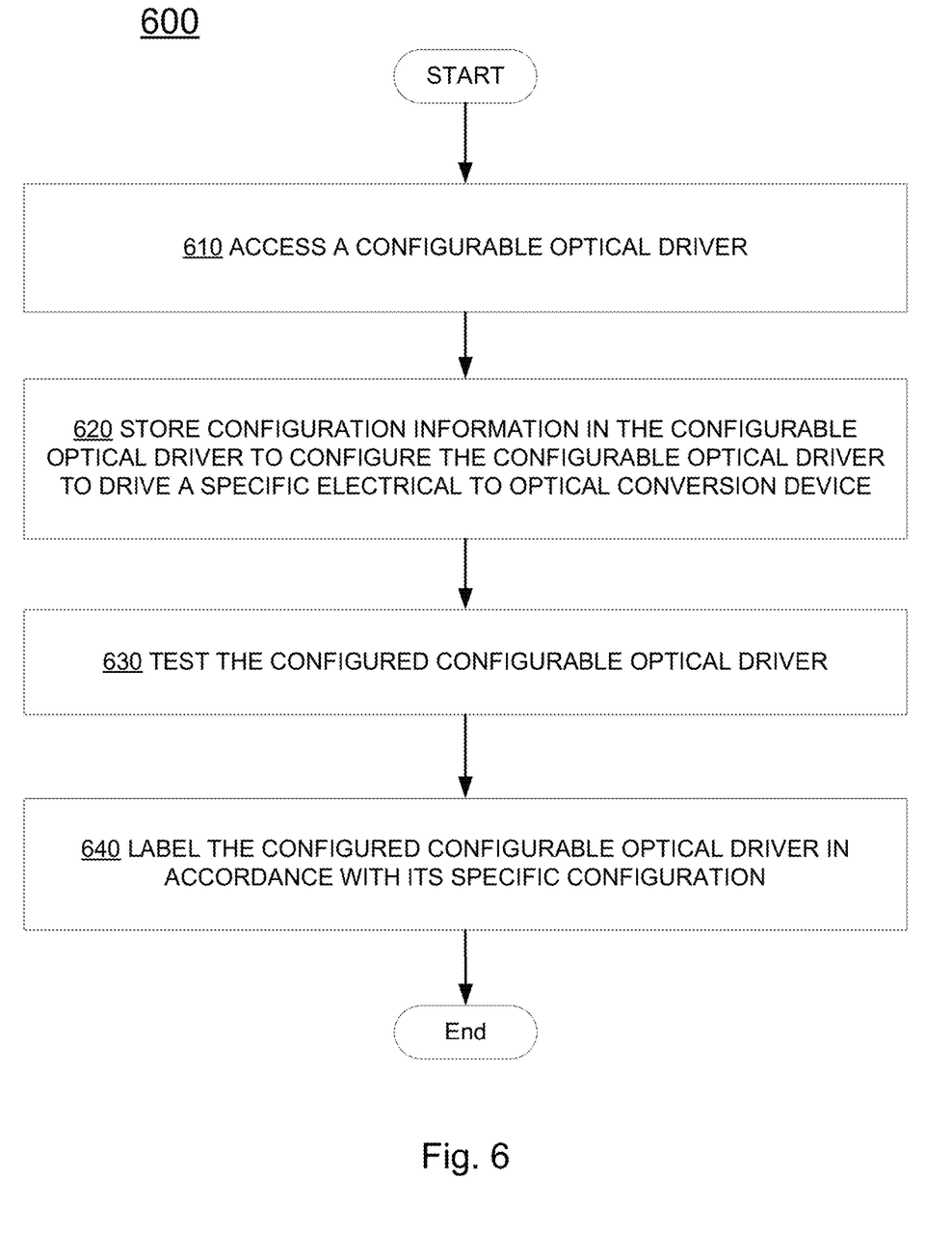
FIG. 6 illustrates an exemplary method for configuring a configurable optical driver, in accordance with embodiments of the present invention.

FIG. 6 illustrates an exemplary method 600 for configuring a configurable optical driver, in accordance with embodiments of the present invention. In 610, a configurable optical driver, for example, configurable optical driver 200 (FIG. 2), is accessed. For example, a configurable optical driver may be placed into a programming device, e.g., an automated test equipment. In 620, configuration information is stored into the configurable optical driver to configure the configurable optical driver to drive a specific type of electrical to optical conversion device, e.g., a specific type of electrical to optical device 120 (FIG. 1), for example, a direct modulation laser (DML). For example, an automated test equipment stores configuration information into programmable memory 250 of configurable optical driver 200 (FIG. 2).

In accordance with embodiments of the present invention, the programmable memory may be a semiconductor memory, in some embodiments. In some embodiments, the programmable memory may be non-semiconductor memory.

In optional 630, the drive function of the configured configurable optical driver is tested for loads corresponding to the specific type of electrical to optical device 120 (FIG. 1). For example, if the configuration information stored into the configurable optical driver configured the configurable optical driver to drive a direct modulation laser (DML), the test would be performed with a load corresponding to a direct modulation laser (DML). In some embodiments, the load is simulated. In some embodiments, the test comprises driving an actual electrical to optical device, e.g., a direct modulation laser (DML).

In optional 640 the configured configurable optical driver is labeled in accordance with its specific configuration to indicate its specific configuration. For example, the configured configurable optical driver is labeled with a part number that indicates it is configured to drive a direct modulation laser (DML). The labeling may be performed prior to subsequent to 630, according to embodiments. The labeling may be performed prior to subsequent to 620, according to embodiments.

Embodiments in accordance with the present invention provide systems and methods for configurable optical drivers. In addition, embodiments in accordance with the present invention provide systems and methods systems and methods for configurable optical drivers that may be configured to drive multiple types of electrical to optical devices. Further, embodiments in accordance with the present invention provide systems and methods for configurable optical drivers that are compatible and complementary with existing systems and methods for optical drivers.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

What is claimed is:

1. A configurable optical driver circuit comprising:
an adjustable current source circuit configurable to drive one of a variety of different types of electrical to optical devices;
an adjustable back-termination resistance circuit configurable to provide a back-termination resistance to said one of a variety of different electrical to optical devices; and
a programmable memory configured to provide configuration information to said adjustable current source circuit and to said adjustable back-termination resistance circuit to configure said adjustable current source circuit and said adjustable back-termination resistance circuit for operation with said one of a variety of different electrical to optical devices.

2. The configurable optical driver circuit of claim 1 wherein said adjustable current source circuit comprises a current mirror.

3. The configurable optical driver circuit of claim 2 further comprising a digital to analog converter to drive said current mirror responsive to a control signal from a clock and data recovery (CDR) circuitry.

4. The configurable optical driver circuit of claim 1 wherein said adjustable back-termination resistance circuit comprises a digitally controlled variable resistance.

5. The configurable optical driver circuit of claim 1 wherein said programmable memory is further configured to accept and store configuration information for a desired type of electrical to optical device from outside of said configurable optical driver circuit after manufacture of said configurable optical driver circuit.

6. The configurable optical driver circuit of claim 1 further comprising a clock and data recovery (CDR) circuit to drive said adjustable current source circuit based on a communications input, wherein said adjustable current source circuit, said adjustable back-termination resistance circuit, said programmable memory and said CDR circuit are embodied on a single integrated circuit within said configurable optical driver circuit.

7. The configurable optical driver circuit of claim 6 wherein said programmable memory is further configured to accept and store configuration information for a desired type of electrical to optical device from outside of said configurable optical driver circuit after manufacture of said single integrated circuit.

8. The configurable optical driver circuit of claim 1 configurable to drive one electrical to optical device of the set of electrical to optical devices comprising directly modulated lasers (DMLs), electro-absorption modulated lasers (EMLs), and vertical-cavity surface-emitting lasers (VCSELs).

9. The configurable optical driver circuit of claim 1 wherein responsive to said configuration information, said adjustable current source circuit is configured to drive a current in the range of 24-90 mA for a DML configuration and to drive a current in the range of 3.4 to 17 mA for a VCSEL configuration.

10. A configurable optical driver circuit comprising:
a configurable optical driver integrated circuit comprising:
a current mirror circuit having an adjustable current range;
digitally controlled variable resistance to adjust back-termination resistance; and
a programmable memory configured to provide configuration information to said current mirror circuit and to said digitally controlled variable resistance to configure said configurable optical driver circuit for operation with one of a variety of different electrical to optical devices;

a passive biasing network coupled to said configurable optical driver integrated circuit for setting DC bias points at driver outputs and at an optical device, and wherein said passive biasing network further comprises a first DC blocking capacitor in series with the transmitting positive output and a second DC blocking capacitor in series with the transmitting negative output of said configurable optical driver circuit.

11. The configurable optical driver circuit of claim 10 wherein said passive biasing network further comprises ferrites on both sides of said first and second DC blocking capacitors.

12. The configurable optical driver circuit of claim 11 wherein an inboard side of said second DC blocking capacitor is configured to be coupled to a transmitter (TX) output power supply external to said configurable optical driver circuit, and wherein an outboard side of said second DC blocking capacitor is configured to be coupled to ground external to said configurable optical driver circuit.

13. The configurable optical driver circuit of claim 12 wherein an outboard side of said first DC blocking capacitor is configured to be coupled, externally to said configurable optical driver circuit, to a bias current output of said configurable optical driver circuit for a vertical-cavity surface-emitting laser (VCSEL) configuration of said configurable optical driver circuit.

14. The configurable optical driver circuit of claim 12 wherein an external terminal of an outboard side of said first DC blocking capacitor is configured to be coupled to an EML offset bias voltage adjustment circuit external to said configurable optical driver circuit for an electro-absorption modulated laser (EML) configuration of said configurable optical driver circuit.

* * * * *